(12) United States Patent         (10) Patent No.:    US 8,928,861 B2
    Kuiper et al.                 (45) Date of Patent:    Jan. 6, 2015

(54) LITHOGRAPHIC APPARATUS

(75) Inventors: Doede Frans Kuiper, Eindhoven (NL); Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 77 days.

(21) Appl. No.: 13/115,334

(22) Filed: May 25, 2011

(65) Prior Publication Data

US 2011/0317141 A1    Dec. 29, 2011

Related U.S. Application Data

(60) Provisional application No. 61/357,834, filed on Jun. 23, 2010.

(51) Int. Cl.
*G03B 27/58* (2006.01)
*G03B 27/68* (2006.01)
*G03F 7/20* (2006.01)

(52) U.S. Cl.
CPC ........ *G03F 7/70775* (2013.01); *G03F 7/70716* (2013.01); *G03F 7/7085* (2013.01)
USPC .............................................. 355/72; 355/52

(58) Field of Classification Search
USPC ................................................ 355/67, 72, 52
See application file for complete search history.

(56) References Cited

U.S. PATENT DOCUMENTS

| 6,977,713 B2 | 12/2005 | Luttikhuis et al. |
| 7,502,103 B2 | 3/2009 | Plug et al. |
| 2001/0006413 A1 | 7/2001 | Burghoorn |
| 2002/0041377 A1* | 4/2002 | Hagiwara et al. ............. 356/399 |
| 2005/0122490 A1 | 6/2005 | Luttikhuis et al. |
| 2007/0279644 A1 | 12/2007 | Plug et al. |
| 2008/0117393 A1 | 5/2008 | Fujiwara et al. |

(Continued)

FOREIGN PATENT DOCUMENTS

| CN | 1627192 | 6/2005 |
| CN | 101082783 | 12/2007 |

(Continued)

OTHER PUBLICATIONS

Korean Office Action mailed Feb. 27, 2013 in corresponding Korean Patent Application No. 10-2011-0059093.

(Continued)

*Primary Examiner* — Peter B Kim
*Assistant Examiner* — Deoram Persaud
(74) *Attorney, Agent, or Firm* — Pillsbury Winthrop Shaw Pittman LLP

(57) ABSTRACT

A lithographic apparatus includes an illumination system configured to condition a radiation beam; a support constructed to support a patterning device, the device being capable of imparting the beam with a pattern in its cross-section to form a patterned radiation beam; a substrate table constructed to hold a substrate; a stage system to position the table relative to a reference structure; a projection system configured to project the patterned radiation beam onto a target portion of the substrate; an optical measurement system including a sensor part and an optical part, the optical part being configured to optically interact with the patterned radiation beam and to transmit a result from the interaction as output to the sensor part, wherein the optical part is arranged on the table, and the sensor part is arranged on the stage system or the reference structure.

12 Claims, 3 Drawing Sheets

(56) References Cited

U.S. PATENT DOCUMENTS

| | | |
|---|---|---|
| 2009/0290139 A1 | 11/2009 | Van Der Sijs et al. |
| 2009/0296057 A1 | 12/2009 | Ruan |
| 2010/0215273 A1 | 8/2010 | Aksenov et al. |
| 2010/0297561 A1 | 11/2010 | Beerens et al. |

FOREIGN PATENT DOCUMENTS

| | | |
|---|---|---|
| CN | 201097108 | 8/2008 |
| CN | 201134009 | 10/2008 |
| JP | 2002-198299 | 7/2002 |
| JP | 2002-324752 | 11/2002 |
| JP | 2006-245145 | 9/2006 |
| JP | 2009252851 A | 10/2009 |
| JP | 2010-028096 | 2/2010 |
| KR | 10-2006-0041791 | 5/2006 |
| TW | 591694 | 6/2004 |

OTHER PUBLICATIONS

Chinese Office Action dated Apr. 3, 2013 in corresponding Chinese Patent Application No. 201110146988.9.

* cited by examiner

LITHOGRAPHIC APPARATUS

CROSS REFERENCE TO RELATED APPLICATIONS

This application claims priority and benefit under 35 U.S.C. §119(e) to U.S. Provisional Patent Application No. 61/357,834, entitled "Lithographic Apparatus", filed on Jun. 23, 2010. The content of that application is incorporated herein in its entirety by reference.

FIELD

The present invention relates to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The lithographic apparatus may include an optical measurement system arranged on a substrate table that is configured to hold the substrate. An example of such an optical measurement system is a device for image position detection used to align a reticle to the substrate table. The reticle is therefore provided with a structure (e.g. a grating) and the substrate table is provided with a complementary structure. By transmitting a radiation beam through the structure on the reticle and the complementary structure on the substrate table and detecting the image by a sensor part on the substrate table, the position and focus of the image can be determined. This position and focus information can be sent to a position control unit or controller of the substrate table which is able to align the reticle to the substrate table based on the information. Instead of transmitting a radiation beam through the complementary structure, the radiation beam may be reflected of the complementary structure.

In case a projection system is used to project the patterned radiation beam onto a target portion of the substrate, an optical measurement system can be provided that is configured to characterize the projection system. Properties and parameters that can be measured are for instance aberrations, the detailed shape of the pupil distribution and/or the transmission (apodisation). The measurement system may include a grating on the substrate table to split a converging wavefront at the convergence point into multiple laterally sheared copies of this wavefront. Interference of the sheared wavefronts is then observed at a sensor part.

With conventional optical measurement systems, electrical wires/cables are needed to power the systems and to transfer their measured data to data processing units. Further, cooling may be required to cool the electronics on the substrate table. The latter may in particular be applicable for EUV lithographic apparatus. This all leads to disturbance forces and torques acting on the substrate table, reducing positioning accuracy and hence overlay and imaging performance.

SUMMARY

It is desirable to provide an improved lithographic apparatus, in particular a lithographic apparatus with an improved overlay and imaging performance.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a stage system to position the substrate table relative to a reference structure; a projection system configured to project the patterned radiation beam onto a target portion of the substrate; and an optical measurement system including a sensor part and an optical part, the optical part being configured to optically interact with a portion of the patterned radiation beam and to transmit a result from the interaction as output to the sensor part, wherein the optical part is arranged on the substrate table, and wherein the sensor part is arranged on the stage system or the reference structure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
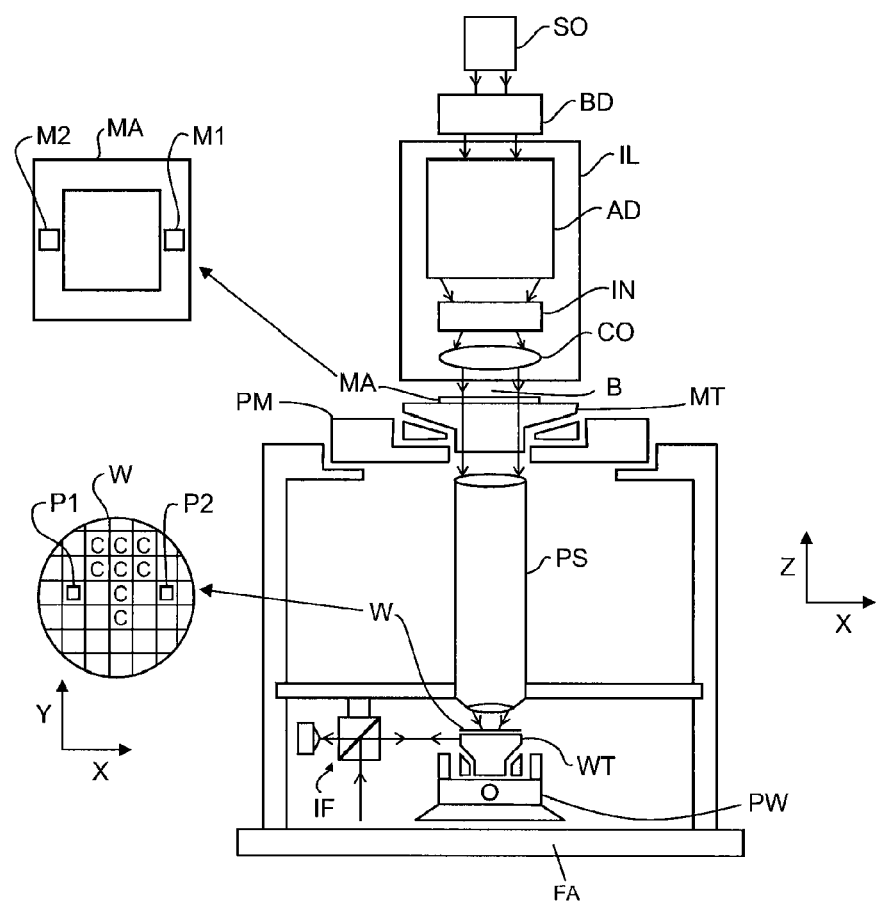
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the mask support structure (e.g., mask table MT), and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
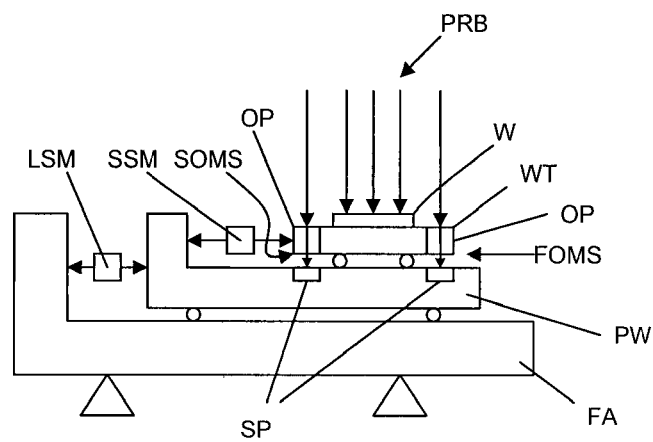
FIG. 2 depicts schematically a part of the lithographic apparatus of FIG. 1 according to one embodiment of the invention.

FIG. 2 depicts schematically in more detail the substrate table WT and the positioning device PW of FIG. 1. The substrate table WT is supported by the positioning device PW, which in turn is supported by a frame FA. The positioning device PW may alternatively be referred to as a stage system.

Between the positioning device PW and the frame FA a long-stroke module LSM is provided for coarse positioning of the substrate table WT relative to the frame FA, which thus acts as a reference structure. Between the positioning device PW and the substrate table WT, a short-stroke module SSM is provided for fine positioning of the substrate table relative to the positioning device PW and thus relative to the frame FA. The stage system is thus used to position the substrate table WT relative to the frame FA. The long-stroke module and the short-stroke module form part of the positioning device PW.

In FIG. 2 the substrate table WT holds a substrate W. The substrate table WT is positioned in a patterned radiation beam PRB such that a portion of the patterned radiation beam is incident to the substrate W and another portion is incident to two optical measurement systems, namely a first optical measurement system FOMS on the right of FIG. 2 and a second optical measurement system SOMS on the left of FIG. 2. Each optical measurement system includes an optical part OP arranged on the substrate table WT and a sensor part SP arranged on the positioning device PW, i.e. the stage system. The optical part OP is configured to interact with a portion of the patterned radiation beam, in this embodiment, an outer portion of the patterned radiation beam. The optical parts outputs the result of the interaction towards the sensor part SP. The sensor part is able to detect the result and possibly converts the output into another quantity, e.g. an electric signal, from which information can be obtained. In an embodiment, the optical part may OP output a reference beam along with the output of the interaction from which spatial coordinates of the result can be derived. It is explicitly mentioned here that the measurement by the optical measurement systems and exposure of the substrate in this embodiment do not take place at the same time.

Interaction between the optical part and the portion of the patterned radiation beam may include any optical operation such as refraction, interference, reflection, polarization, filtering, etc, as performed by optical components such as lenses, mirrors, gratings, polarizers, filters, etc. In an embodiment, the optical part includes at least a grating.

A benefit of providing the sensor part on the stage system is that no cables, wires or hoses need to be provided to the substrate table, as all cable and wiring needing components are arranged on the stage system. As a result, the disturbances from the cables and wires to the substrate table are reduced, so that the positioning accuracy of the substrate table is improved and thus the overlay and imaging performance.

Figure 3:
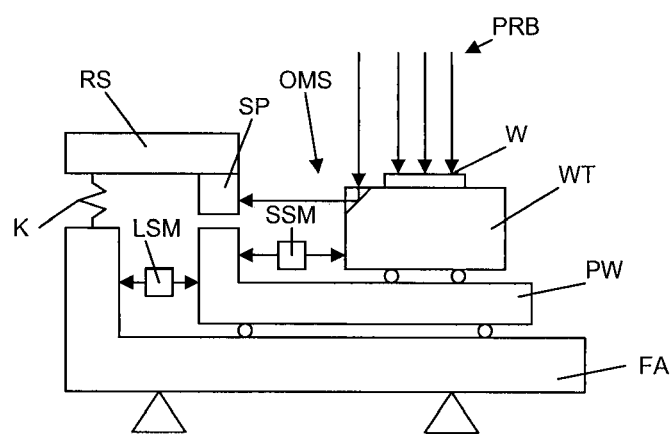
FIG. 3 depicts schematically a part of a lithographic apparatus according to another embodiment of the invention.

FIG. 3 depicts schematically a part of a lithographic apparatus according to another embodiment of the invention. The part could be used in a lithographic apparatus according to FIG. 1. Shown are a frame FA which supports a positioning device PW and a reference structure RS. The reference structure is low-frequency supported by the frame FA so that transmittance of vibrations from the frame to the reference structure is prevented as much as possible. The low-frequency support is indicated as a spring K. Between the frame and the positioning device PW a long-stroke module LSM is provided for coarse positioning of the positioning device relative to the reference structure RS.

Between the substrate table WT and the positioning device PW a short-stroke module SSM is provided for fine positioning of a substrate table WT relative to the positioning device PW and thus relative to the reference structure RS. The positioning device PW is thus used as a stage system to position the substrate table WT.

The substrate table WT holds a substrate W. In FIG. 3, the substrate table is positioned in a patterned radiation beam PRB so that a portion of the patterned radiation beam is incident to the substrate W and a portion of the patterned radiation beam is incident to an optical measurement system OMS. In practice, the substrate W may not be exposed to the patterned radiation beam during measurement by the optical measurement system OMS, and the optical measurement system may not be used during exposure of the substrate to the patterned radiation beam.

The optical measurement system includes an optical part OP interacting with a portion of the patterned radiation beam PRB and transmitting the result of the interaction as output to a sensor part SP. The optical part OP is arranged on the substrate table WT and the sensor part SP is arranged on the reference structure RS. Alternatively, the sensor part SP can also be arranged on the frame FA.

A benefit of providing the sensor part SP on the reference structure or frame FA and not on the positioning device PW is that no cables, wires and/or hoses need to be provided to the positioning device PW or substrate table WT which are the moving components. Therefore, the disturbances due to the cables, wires and/or hoses to the positioning device and substrate table are eliminated, thereby improving the overlay and imaging performance.

Figure 4:
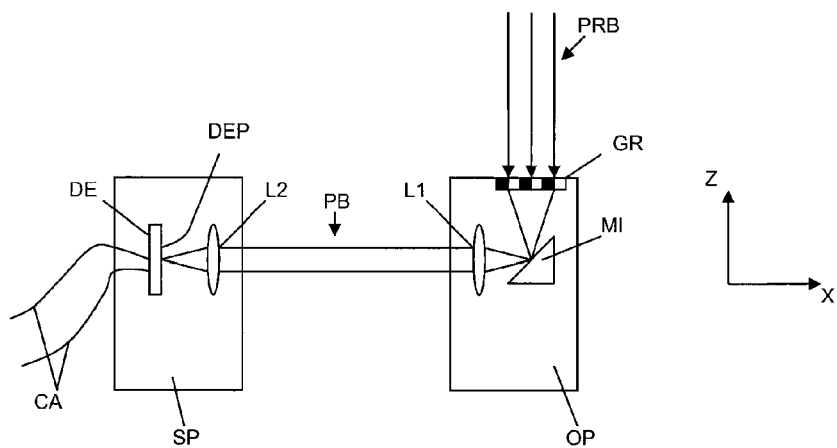
FIG. 4 depicts schematically an optical measurement system according to yet another embodiment of the invention.

FIG. 4 depicts schematically in more detail an optical measurement system according to one embodiment of the invention. Shown are an optical part OP and a sensor part SP. The optical part includes a grating substantially perpendicular to a portion of a patterned radiation beam which is substantially parallel to a Z-direction similar to the lithographic apparatus of FIG. 1. The portion of the patterned radiation beam may have interacted with another grating at reticle level of a lithographic apparatus and/or has passed through a projection system thereby deliberately gathering information about parameters and properties of the projection system.

Subsequently, after passing the grating, the portion of the patterned radiation beam is reflected of a mirror MI to change the main orientation of the portion of the patterned radiation beam from vertical to horizontal. Finally, the portion of the patterned radiation beam passes a first lens L1 to convert the portion of the patterned radiation beam into a substantially parallel beam PB. A benefit of a parallel beam is that the distance between the optical part OP and the sensor part SP has no influence on the transmittal from optical part OP to sensor part SP.

The sensor part SP includes a second lens L2 to focus the parallel beam onto a detector DE converting the radiation into electric signals which can be processed by a suitable processing unit (broadly termer processor) or control unit (broadly termed controller). The detector DE includes a detector plane DEP sensitive to radiation, wherein the detector plane extends in a plane parallel to the patterned radiation beam PRB. Other orientations of the parallel beam PB and the detector plane DEP are also possible, e.g. at an angle of 45 degrees relative to the horizontal or vertical.

To supply power to the detector and transfer data obtained by the detector from the sensor part to e.g. a processing unit, cables CA are provided. In one embodiment, cooling is desired for the sensor part, so that the cables also include hoses to carry a coolant, e.g. water from and to the sensor part.

Figure 5:
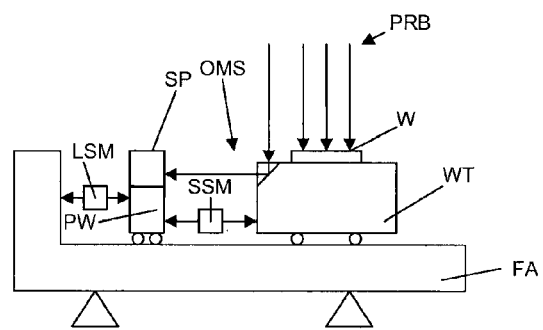
FIG. 5 depicts schematically a part of a lithographic apparatus according to a further embodiment of the invention.

FIG. 5 depicts schematically an alternative embodiment of the lithographic apparatus according to FIG. 2. In FIG. 2, the stage system, i.e. positioning device PW, also supports the substrate table WT. FIG. 5 shows a part of a lithographic apparatus in which a substrate table WT is positioned by a stage system PW relative to a frame FA, wherein the substrate table WT is supported by the frame FA and not by the stage system PW. Between the stage system PW and the frame a long-stroke module LSM is provided to coarse position the stage system relative to the frame FA. Between the stage system PW and the substrate table WT a short-stroke module SSM is provided to fine position the substrate table relative to the stage system and thus relative to the frame FA.

In FIG. 5, the substrate table holds a substrate W. The substrate table is positioned such that a portion of the patterned radiation beam is incident to the substrate and another portion is incident to an optical measurement system OMS. In practice, the optical measurement system taking measurements is not performed simultaneously with exposure of the substrate by the patterned radiation beam.

The optical measurement system OMS includes an optical part OP arranged on the substrate table and a sensor part SP arranged on the stage system similar to the lithographic apparatus according to FIG. 2.

It is explicitly mentioned here that although the embodiments shown in the drawings use long-stroke modules as well as short-stroke modules, the invention is also applicable to embodiments using only one module to position the substrate table. For instance, the embodiment of FIG. 3 could be adapted by removing the short-stroke module SSM, incorporating the substrate table WT into the stage system PW, and replace the long-stroke module LSM by a module for coarse and fine positioning of the substrate table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
a support constructed to support a patterning device, the patterning device being capable of imparting a radiation beam with a pattern in its cross-section to form a patterned radiation beam;
a substrate table constructed to hold a substrate;
a stage system to position the substrate table relative to a reference structure;
a projection system configured to project the patterned radiation beam onto a target portion of the substrate;
an optical measurement system comprising a sensor part and an optical part, the optical part being configured to optically interact with a portion of the patterned radiation beam and to transmit a result from the interaction as output to the sensor part,
wherein the optical part is arranged on the substrate table so that said portion of the patterned radiation beam is receivable by the optical part and another portion of said patterned radiation beam is receivable by the substrate, and wherein the sensor part is arranged on the stage system, and
wherein said substrate table is moveable relative to the stage system during positioning of the substrate table relative to the reference structure so that said optical part and sensor part are moveable relative to each other during said positioning.

2. The lithographic apparatus of claim 1, wherein the optical part comprises a grating.

3. The lithographic apparatus of claim 1, wherein the sensor part comprises a detector configured to convert the output of the optical part into an electric signal.

4. The lithographic apparatus of claim 3, wherein the detector comprises a detector plane sensitive to radiation, the detector plane extending in a plane substantially perpendicular to the patterned radiation beam.

5. The lithographic apparatus of claim 3, wherein the detector comprises a detector plane sensitive to radiation, the detector plane extending in a plane substantially non-perpendicular to the patterned radiation beam.

6. The lithographic apparatus of claim 5, wherein the plane is substantially parallel to the patterned radiation beam.

7. The lithographic apparatus of claim 3, wherein the detector is a photosensor or CCD camera.

8. The lithographic apparatus of claim 1, wherein the optical part is configured to output a parallel beam towards the sensor part.

9. The lithographic apparatus of claim 1, wherein the optical part is configured to output the result of the interaction combined with a reference beam from which spatial coordinates of the result can be derived.

10. The lithographic apparatus of claim 1, wherein the optical measurement system is configured to measure a mutual relative position between the substrate table and the patterning device.

11. The lithographic apparatus of claim 1, wherein the optical measurement system is configured to characterize the projection system.

12. The lithographic apparatus of claim 1, comprising a short stroke motor configured to move said substrate table relative to the stage system.

* * * * *